United States Patent
Gudmondson et al.

(10) Patent No.: US 7,355,652 B2
(45) Date of Patent: Apr. 8, 2008

(54) INVERSE TRACKING OVER TWO DIFFERENT CLOCK DOMAINS

(75) Inventors: Daniel Gudmondson, Austin, TX (US); John L. Melanson, Austin, TX (US); Rahul Singh, Austin, TX (US); Ahsan Habib Chowdhury, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 539 days.

(21) Appl. No.: 10/964,556

(22) Filed: Oct. 13, 2004

(65) Prior Publication Data
US 2006/0077296 A1    Apr. 13, 2006

(51) Int. Cl.
*H03L 7/00* (2006.01)

(52) U.S. Cl. .............. 348/536; 348/537; 348/441; 348/445

(58) Field of Classification Search ........ 348/536–537, 348/441, 445–448, 458–459, 540–541, 554–556, 348/607, 443–444, 581, 704, 542, 543; *H03L 7/00; H04N 7/01*
See application file for complete search history.

(56) References Cited

U.S. PATENT DOCUMENTS

| | | | |
|---|---|---|---|
| 5,986,635 A | 11/1999 | Naka et al. | |
| 6,020,927 A * | 2/2000 | Tanaka et al. | 348/458 |
| 6,285,402 B1 | 9/2001 | Miyazaki et al. | |
| 6,441,860 B1 * | 8/2002 | Yamaguchi et al. | 348/555 |
| 6,833,875 B1 * | 12/2004 | Yang et al. | 348/665 |
| 2004/0119888 A1 | 6/2004 | Arai | |
| 2007/0248285 A1 * | 10/2007 | Lippincott | 382/298 |

FOREIGN PATENT DOCUMENTS

DE    100 13 935 A 1    4/2001

OTHER PUBLICATIONS

International Search Report and Written Opinion received in corresponding PCT Application No. PCT/US2005/035580 dated Mar. 21, 2006.

* cited by examiner

*Primary Examiner*—Trang U. Tran
(74) *Attorney, Agent, or Firm*—Wong, Cabello, Lutsch, Rutherford, & Brucculeri, LLP

(57) ABSTRACT

A video decoder in which the video source clock is generated entirely in the digital domain is disclosed herein. By creating a virtual version of the source clock in a numeric oscillator, the amount of noise in the system is substantially reduced. Furthermore, by transferring the digitized video signal, sampled with an asynchronous crystal clock, into the source clock domain, the accuracy of the brightness (amplitude) and color (phase) information can be greatly enhanced.

13 Claims, 4 Drawing Sheets

INVERSE TRACKING OVER TWO DIFFERENT CLOCK DOMAINS

BACKGROUND OF THE INVENTION

1. Field of the Invention

The invention generally relates to video decoders and more specifically to systems and techniques for correcting the time base of a sampled composite video signal wherein the sample clock and video source clock are asynchronous.

2. Description of Related Art

There is a large surge in the use of digital video devices today. Examples include: digital televisions, LCD (Liquid Crystal Display) TVs (televisions) and monitors, DVD (Digital Versitile Disc) recorders, personal video recorders, PC (Personal Computer) video cards, video capture and streaming applications, and video conferencing. In many cases, these units need to receive an analog video signal, which may be one of the composite signals, such as NTSC (National Television Standards Committee), PAL (Phase Alternating Line), SECAM (Sequential Couleur Avec Mémoire), S-video, component video, or RGB (Red, Green, Blue). It is then desirable to produce the proper digital output, such as eight or ten bit ITU-R (International Telecommunication Union-Radio-Communication) BT (Broadcasting Service-television) 656. It is preferred that all the video decoding be done in a single chip for all of these formats. The decoder not only has to handle composite signals, which means it must be able to determine the chroma and luma values, but it also must handle vertical blanking interval (VBI) data and handle VCR (video cassette recorder) signals, which may be unstable signals.

Although a number of such systems have been developed, it is always desirable to improve the output and capabilities of the particular video decoder. For example, it is desirable to sample a composite video signal with a sample clock that is asynchronous with the video source clock. This provides for increased noise immunity and thus higher video quality. However, these gains can only be realized if the time base of the sampled composite video signal is converted from the sample clock back to the video source clock so that brightness and color information contained in the video signal can be more accurately recovered.

Therefore, systems and methods for converting signals from a sample clock domain to a source clock domain are needed. It would be further advantageous to recover the source clock entirely in the digital domain such that there is minimal noise injected into the video decoding process, whether as a result of clock noise or other means.

SUMMARY OF THE INVENTION

The present invention is directed to a video decoder that addresses the foregoing problems. The present invention differs from the prior art in that the source clock is generated entirely in the digital domain, which has the following advantages. By creating a virtual version of the source clock in a numeric oscillator, the amount of noise in the system is substantially reduced. Furthermore, by transferring the digitized video signal, sampled with an asynchronous crystal clock, into the source clock domain, the accuracy of the brightness (amplitude) and color (phase) information can be greatly enhanced.

DETAILED DESCRIPTION OF THE PREFERRED EMBODIMENT

Figure 1:
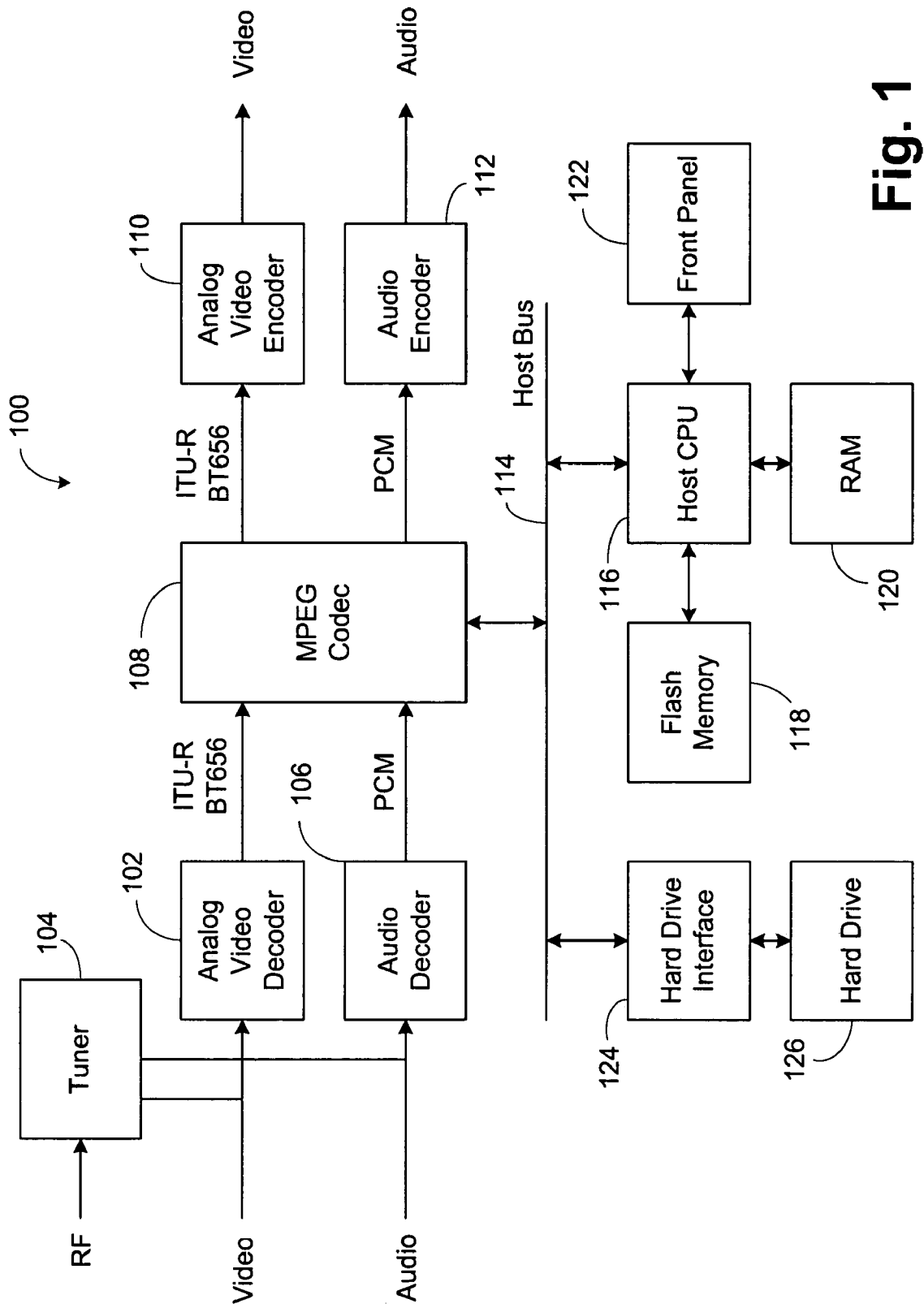
FIG. 1 displays a block diagram of an exemplary personal video recorder using an analog video decoder according to the present invention.

Referring now to FIG. 1, an exemplary personal video recorder (PVR) 100 is shown. This is an exemplary use of analog video decoder 102, and it is understood that the analog video decoder can be used in multiple applications including digital televisions, LCD TVs, DVD recorders, video capture situations, and the like. A radio frequency (RF) or broadcast signal is provided to a tuner 104. The tuner 104 provides both video and audio outputs. The video output from the tuner 104 or a video signal from an external connection is provided to analog video decoder 102. The audio signal from the tuner 104 or an external audio signal is provided to an audio decoder 106. The output from the analog video decoder 102 is preferably an ITU-R BT 656 format digital signal, which is either an eight or ten bit signal. This digital signal from video decoder 102 is provided to an MPEG (Moving Pictures Expert Group) codec 108 to perform video compression in the digital domain. Similarly, the audio decoder provides a PCM signal to the MPEG codec 108 to allow it to perform compression of the audio signal. The MPEG codec 108 in output mode provides an ITU-R BT 656 digital stream to an analog video encoder 110, which in turns produces an analog video signal output. Similarly, the MPEG codec 108 provides a PCM digital signal stream to an audio encoder 112, which provides an analog audio signal output.

The MPEG codec 108 is connected to a host bus 114 of a host CPU (central processing unit) 116. The host CPU 116 performs processing operations and controls the various devices located in the PVR 100. The host CPU 116 is connected to flash memory 118 to hold its program and RAM (random access memory) 120 for data storage. The host CPU 116 also interfaces with a front panel 122. A hard drive interface 124 is also connected to the host bus 114, and a hard drive 126 is connected to the hard drive interface 124. The various encoders 102 and 106 and decoders 110 and 112 are also connected to the host bus 114 to allow control and setup by the host CPU 116.

In operation, audio and video would be provided to the analog video decoder 102 and the audio decoder 106, which would then provide their digital streams to the MPEG codec 108. The host CPU 116 programs the MPEG codec 108 to transfer data to the hard drive interface 124, and thus to the hard drive 126, for storage. The host CPU 116 could at a later time direct data to be transferred from the hard drive 126 to the MPEG codec 108 for playback.

Thus, an analog video decoder 102 is an important part of such analog-to-digital video devices.

Figure 2:
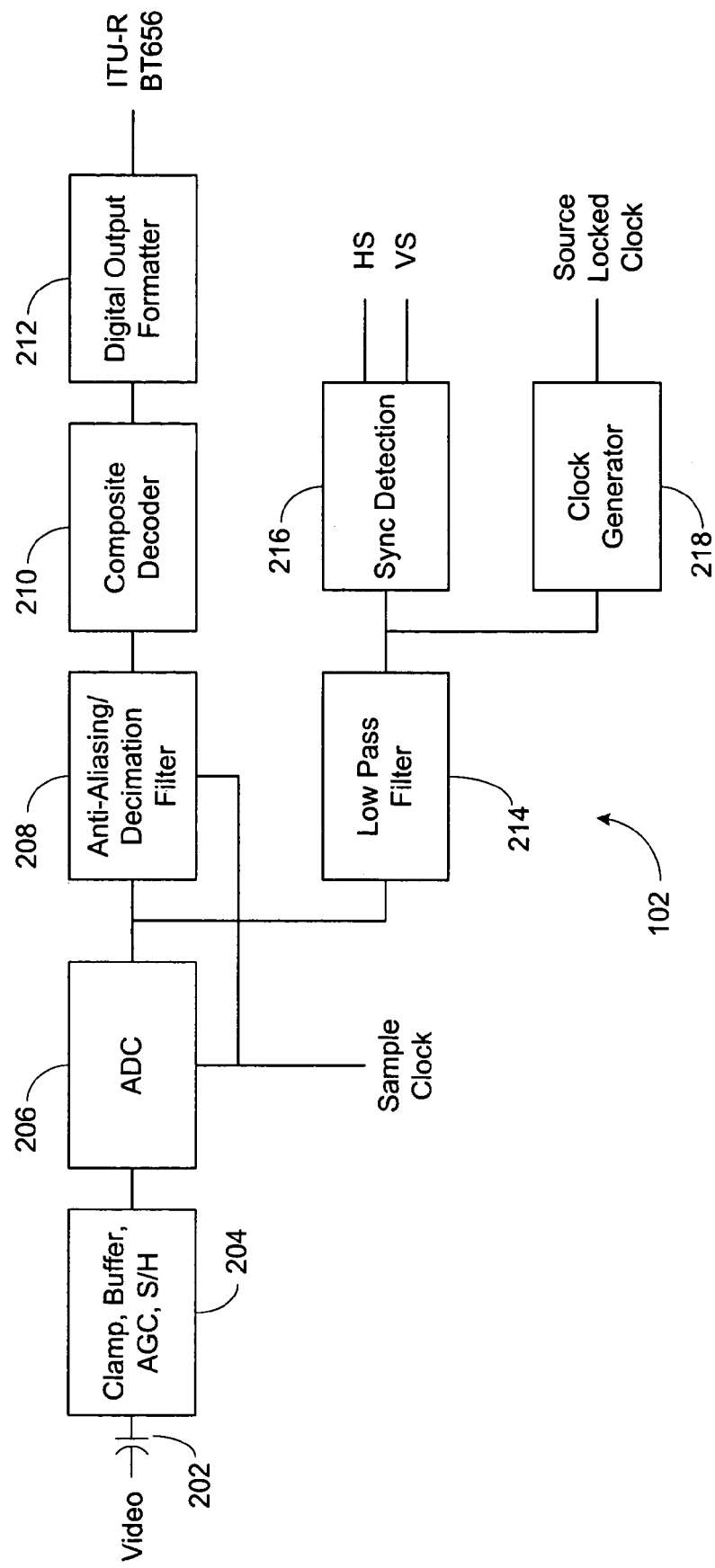
FIG. 2 is a block diagram of an analog video decoder according to the present invention.

A block diagram of an exemplary analog video decoder is shown in FIG. 2. The video signal is provided to an external capacitor 202 and is then provided to a clamp, buffer, automatic gain control (AGC) and sample and hold (S/H) block 204. This block 204 provides clamping of the video signal to ensure that the video signal does not exceed limits, impedance buffering and line driving, and automatic gain control and sample and hold. The output of block 204 is then utilized by an analog-to-digital converter (ADC) 206, which does the actual analog-to-digital conversion of the video rate signals. The ADC 206 is preferably operated on a sample clock, which is a free running sample clock and is not locked to the source video in the preferred embodiment. It is understood that in alternate embodiments a source locked clock signal could be used. The output of the ADC 206 is provided to an anti-aliasing/decimation filter 208 because preferably the ADC 206 oversamples the video signal for increased accuracy. The anti-aliasing portion is a low pass filter used to remove sampling alias effects. The decimation filter then reduces the effective sample rate down to the desired rate, such as 27 MHz. The output of the anti-aliasing/ decimation filter 208 is provided to a composite decoder 210 in the case of a composite video signal, such as NTSC, PAL or SECAM. The composite decoder 210 separates the luma and chroma signals and provides the signals to a digital output formatter 212, which produces a 4:2:2, eight or ten bit signal according to the ITU-R BT 656 standard.

The output of the analog-to-digital converter 206 is also provided to a low pass filter 214, which removes any of the video content, leaving the sync signals. The output of the filter 214 is then provided to a sync detector 216, having outputs that are horizontal and vertical sync signals. The output of low pass filter 214 is also connected to a clock generator 218, which is effectively a PLL and produces a source locked clock used by other devices, if appropriate.

Various details of select parts will now be provided.

A video decoder according to the present invention samples video signals on a clock that is asynchronous with the source clock of the video signal. In one embodiment, the input video signal is sampled with a 27 MHz high precision crystal. One benefit of an asynchronous sample clock is that no clock noise is introduced into the A/D converter. However, at some point, all of the information needs to be converted to a single clock. In the case of video signals, the source clock is required, among other things, for recovering color information. Thus, output video quality depends on being able to accurately recover the source clock.

Figure 3:
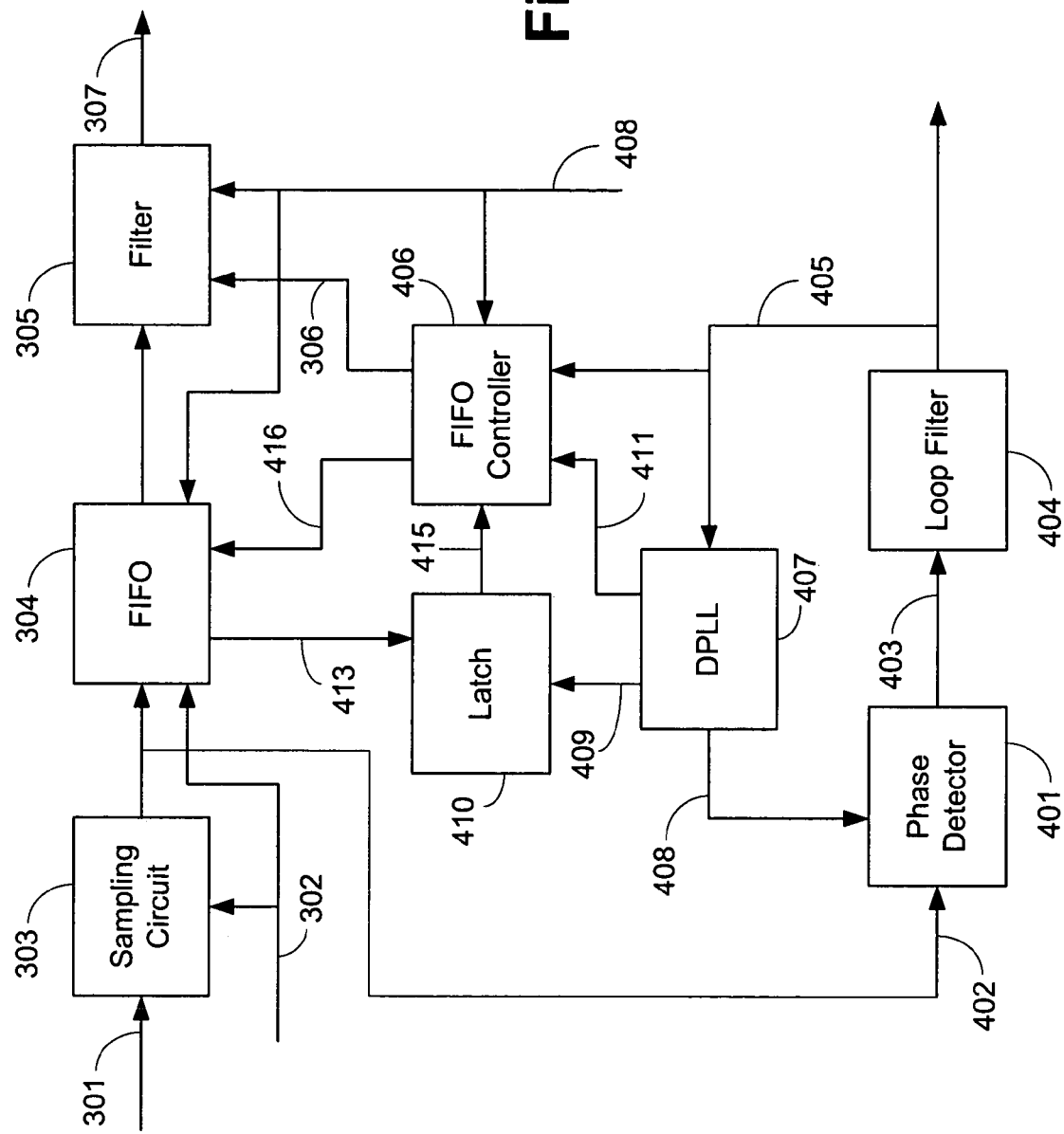
FIG. 3 is a block diagram schematically indicating the flow of the video signal from the sample clock domain to the source clock domain in a video decoder and the clock recovery circuit used to assist such flow according to the present invention.

Data flow from the sample clock domain to the source clock domain is schematically illustrated in FIG. 3. The incoming composite video sample 301 is input into sampling circuit 303. Sampling circuit 303 also receives sample clock signal 302, which, as noted above, originates from a 27 MHz high precision crystal, although other sampling rates could be used without departing from the present invention. Sampling circuit 303 creates a stream of digital samples of the composite video waveform, which are then input into first in first out ("FIFO") transfer buffer 304.

FIFO buffer 304 serves as the boundary between the sample clock domain and the source clock domain. The incoming video samples from sampling circuit 303 arrive at a rate determined by the sample clock. Video samples leave FIFO buffer 304 at a rate determined by the source clock of the video signal. Specifically, the samples are pulled into filter 305, which also receives as an input source clock signal 306, which is recovered from the incoming video signal. Further details of the source clock recovery and the operation of filter 305 are discussed below.

FIFO buffer 304 is sized to account for deviations between the sample clock crystal, typically 27 MHz, (which will vary slightly about the "true" frequency) and the source clock (which is a "pure" 27 MHz clock). The output 307 of the FIFO buffer is the time base corrected video signal.

Even though this clock is of high precision, it has an absolute error from the ideal frequency (source) of perhaps 200 parts per million. This frequency error means that each field of video could have more than 100 extra clocks compared to the ideal number (450,450 clocks in the case of NTSC). This difference from the ideal (source) clock would generate artifacts in the decoded chroma, and luma that could be seen as tones or rolling errors in the picture. The degradation arises because of the analog nature of the original composite video signal. Brightness and color information is encoded in the amplitude and phase of the video signal. Thus, slight deviations in sample timing, left uncorrected, will introduce amplitude and phase errors that alter the brightness and color information.

As noted above, one portion of video decoder 102 is clock generator 218. The function of clock generator 218 is to restore the clock from the source video signal, i.e., to generate a source locked clock. In accordance with the present invention, the clock generator 218 produces stable 27 MHz and 54 MHz source locked clocks entirely in the digital domain using a digital PLL/numeric oscillator.

Figure 4:
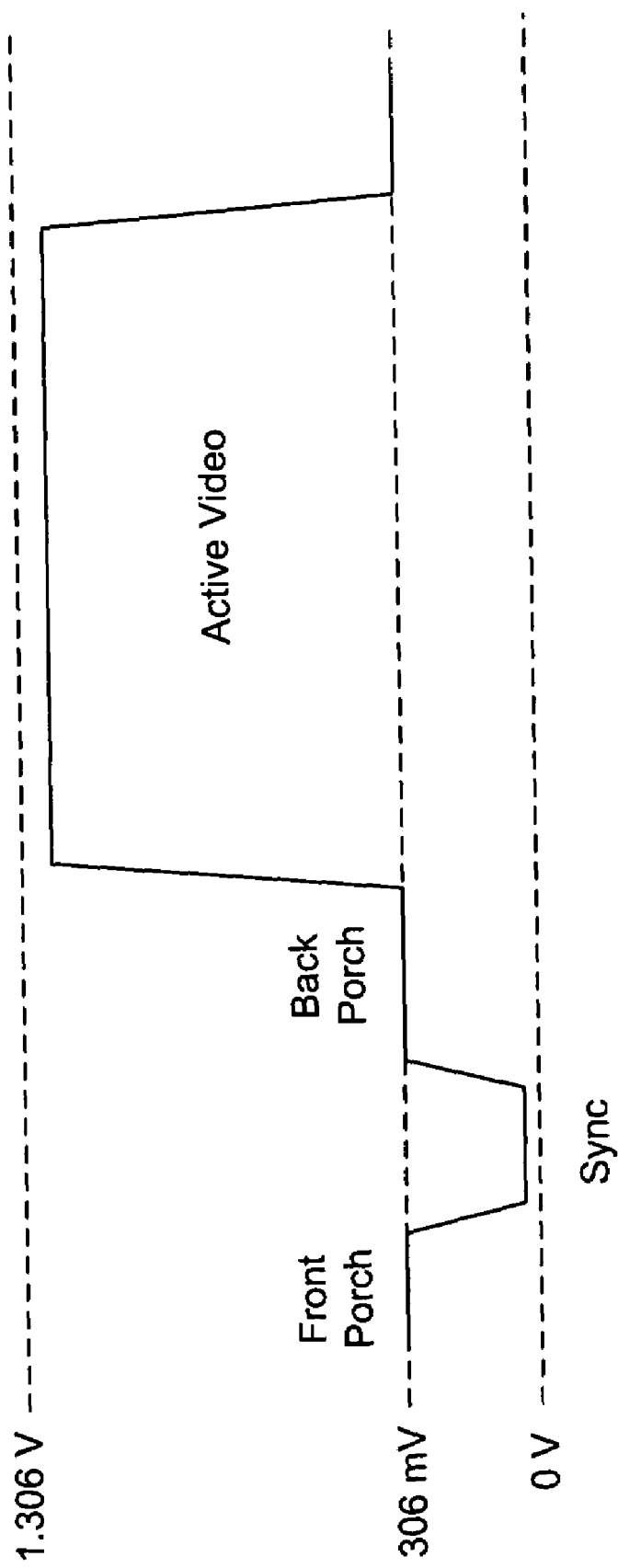
FIG. 4 illustrates the basic components of a composite video signal according to the prior art.

The video clock recovery circuit (illustrated in FIG. 3) produces a source (or line) locked clock based on the horizontal rate input, i.e., the line rate of the composite video signal. A portion of a composite video signal corresponding to one line of video information is illustrated in FIG. 4. As would be understood by one skilled in the art, each line of the composite video signal includes four basic portions: a front porch, a sync pulse, a back porch, and an active video portion. In a most basic sense, the front porch and sync pulse are used for timing synchronization. The back porch contains the blank level for luma and the color sub carrier or color burst timing information, while brightness information resides in the active video portion of the signal. A single frame of a video image is comprised of a plurality of these lines, and in the case of NTSC video each frame is comprised of two fields, each containing a plurality of lines.

In any case, recovering the source clock of the video signal is generally accomplished by extracting the midpoint of horizontal sync edge (falling edge). The phase error between this edge and the rising edge of the clock generated by a digital PLL (Phase Locked Loop)/numeric oscillator (DPLL) 407 is measured and used as a feedback signal for the numeric oscillator. The clock recovery "circuit" is schematically illustrated in FIG. 3.

The phase detector 401 receives the incoming sample data 402 (sampled on the 27 MHz crystal) from the sampling circuit 303, and resets a horizontal counter from the midpoint of the falling edge of the horizontal synchronization pulse. The total count of the horizontal counter is retained prior to being reset to zero on the falling edge of the next horizontal sync pulse. If the sample clock is exactly 27 MHz there should be 1716 clock pulses between horizontal sync pulses. If the sample clock deviates from this number, a ratio is computed as 1716 (the number of 27 MHz clock pulses that should be present between horizontal sync pulses of a composite video signal) divided by the horizontal counter total.

This ratio, output 403 from the phase detector 401, is a comparison of the source clock generated by the digital PLL/numeric oscillator 407 and the 27 MHz crystal clock used for the A/D sampling. This ratio may be used to perform the time base correction, although in a preferred embodiment, a moving average 405 of three consecutive ratios, computed by loop filter 404, is used.

The computed ratio 405 between the sample clock and source clock is fed into the digital PLL/numeric oscillator 407. The computed ratio is used in the digital PLL/numeric oscillator 407 to keep the digitally generated clock in synchronicity with the source signal. The digital PLL/numeric oscillator 407 provides a source locked clock signal 408 that is the reference input for the phase detector 401, as well as a time signal fed into a FIFO controller 406. The FIFO controller 406 controls the FIFO transfer buffer 304. The source locked clock signal 408 is generated using a fractional N synthesizer with 25 fractional bits, resulting in an absolute jitter limit of 100 picoseconds.

The digital PLL/numeric oscillator 407 also provides a framing strobe 409, essentially a horizontal sync signal developed from the source locked clock, to latch circuit 410. The latch circuit 410 is used to receive the write address 413 of pixel data into the FIFO buffer 304. The write address is developed in the FIFO buffer 304 and increments with every write to the FIFO buffer 304. At each line, latch 410 is re-latched to the source locked clock signal 408 to prevent forward accumulation of error due to round off in the sample clock to source clock ratio.

The FIFO controller 406 uses the time signal 411 and the output 415 of the latch 410 to develop a read address pointer 416 provided to the FIFO buffer 304. The FIFO buffer 304 uses the read address pointer 416 value and the source locked clock 408 to transfer data to the filter 305. The FIFO controller 406 also receives the ratio 405 and the source locked clock 408 and provides a time code value 306 which represents the phase offset for each sample.

Once recovered, the source locked clock signal 408 is provided to filter 305 discussed briefly above. Filter 305 receives as its input the samples from FIFO buffer 304 and the source locked clock signal 408. In basic operation, the filter 305 serves to adjust the amplitude and/or phase of the samples as necessary to transfer them from the sample clock domain to the source clock domain. In one embodiment, the filter 305 is a 4-tap time varying quadratic filter similar to that disclosed in Vankka, et al. "GSM/EDGE/WCDMA Modulator with On-chip D/A Converter," IEEE Transactions on Circuits and Systems, October 2002, which is hereby incorporated by reference. Because the phase offset changes on every source clock cycle, the interpolation filter coefficients are time-varying.

Thus by providing a mechanism for recovering the video source clock entirely in the digital domain, the error/noise performance of a video decoder may be substantially enhanced while reducing the cost and complexity of the video decoder. While illustrative embodiments of the invention have been illustrated and described, it will be appreciated that various changes can be made therein without departing from the spirit and scope of the invention.

The invention claimed is:

1. A method of processing an analog signal having an intrinsic source clock, the method comprising:
    sampling the analog signal according to a sample clock asynchronous with the intrinsic source clock so as to produce a sequence of digital samples forming a digital representation of the analog signal;
    storing the digital samples in a transfer buffer at a rate corresponding to the sample clock;
    retrieving the digital samples from the transfer buffer at a rate corresponding to the intrinsic source clock;
    filtering the digital samples to correct at least one of an amplitude error and a phase error caused by jitter in the sample clock; and
    providing the digital samples to a source clock recovery circuit configured to recover the intrinsic source clock from the digital samples.

2. The method of claim 1 wherein the transfer buffer is a first in, first out buffer.

3. The method of claim 1 wherein filtering the digital samples includes passing the samples through a four-tap time varying quadratic filter.

4. The method of claim 1 wherein the source clock recovery circuit generates the source clock entirely in the digital domain.

5. The method of claim 4 wherein the source clock recovery circuit comprises a digital phase lock loop and a numeric oscillator.

6. The method of claim 5 wherein filtering the digital samples includes passing the samples through a four-tap time varying quadratic filter.

7. A video decoder comprising:
    an input circuit configured to receive a composite video signal and digitally sample the composite video signal using a sample clock asynchronous with an intrinsic source clock of the composite video signal;
    a transfer buffer configured to receive samples of the composite video signal at a rate corresponding to the sample clock;
    a clock recovery circuit configured to receive the samples of the composite video signal, recover the intrinsic source clock from the samples, and provide the recovered intrinsic source clock to the video decoder; and
    a filter for correcting at least one of an amplitude error and a phase error in the samples caused by jitter in the sample clock, wherein the filter receives as an input the recovered intrinsic source clock from the clock recovery circuit.

8. The video decoder of claim 7 wherein the clock recovery circuit generates the intrinsic source clock entirely in the digital domain.

9. The method of claim 8 wherein the clock recovery circuit comprises a digital PLL and a numeric oscillator.

10. The video decoder of claim 7 wherein the clock recovery circuit comprises:
    a phase detector configured to receive at a first input the samples of the composite video signal and configured to receive at a second input a digitally generated clock signal; and
    a digital phase lock loop and numeric oscillator configured to create the digitally generated clock signal and to lock the frequency and phase of the digitally generated clock signal to the intrinsic source clock.

11. The video decoder of claim 10 wherein the phase detector detects the phase between a rising edge of the digitally generated clock signal and a synchronization pulse of the composite video signal.

12. The video decoder of claim 7 wherein the filter is a four-tap time varying quadratic filter.

13. The video decoder of claim 11 wherein the filter is a four-tap time varying quadratic filter.

* * * * *